US011306971B2

(12) United States Patent
Gajendra (10) Patent No.: US 11,306,971 B2
(45) Date of Patent: Apr. 19, 2022

(54) HEAT EXCHANGER WITH MULTISTAGED COOLING

(71) Applicant: Applied Materials, Inc., Santa Clara, CA (US)

(72) Inventor: Manoj A. Gajendra, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 182 days.

(21) Appl. No.: 16/668,447

(22) Filed: Oct. 30, 2019

(65) Prior Publication Data
US 2020/0191488 A1 Jun. 18, 2020

Related U.S. Application Data

(60) Provisional application No. 62/779,385, filed on Dec. 13, 2018.

(51) Int. Cl.
*F28D 1/02* (2006.01)
*F28F 9/00* (2006.01)

(52) U.S. Cl.
CPC ............ *F28D 1/0246* (2013.01); *F28F 9/002* (2013.01); *F28D 2001/0266* (2013.01); *F28D 2001/0273* (2013.01)

(58) Field of Classification Search
CPC ........... F28D 1/0246; F28D 2001/0266; F28D 2001/0273; F28D 1/0472; F28D 1/0473;
(Continued)

(56) References Cited

U.S. PATENT DOCUMENTS 361,803 A * 4/1887 Andrews ................. F28D 7/024
165/163
389,900 A * 9/1888 Wainwright ............ F28D 7/024
165/163
(Continued)

FOREIGN PATENT DOCUMENTS

CN 102034773 A 4/2011
CN 202675943 U 1/2013
(Continued)

OTHER PUBLICATIONS

International Search Report dated Feb. 14, 2020 for Application No. PCT/US2019/058768.
(Continued)

*Primary Examiner* — Paul Alvare
*Assistant Examiner* — Jose O Class-Quinones
(74) *Attorney, Agent, or Firm* — Patterson + Sheridan LLP (57) ABSTRACT

A heat exchanger for abating compounds produced in semiconductor processes. When hot effluent flows into the heat exchanger, a coolant can be flowed to walls of a fluid heat exchanging surface within the heat exchanger. The heat exchanging surface can include a plurality of channel regions which creates a multi stage cross flow path for the hot effluent to flow down the heat exchanger. This flow path forces the hot effluent to hit the cold walls of the fluid heat exchanging surface, significantly cooling the effluent and preventing it from flowing directly into the vacuum pumps and causing heat damage. Embodiments described herein also relate to methods of forming a heat exchanger. The heat exchanger can be created by sequentially depositing layers of thermally conductive material on surfaces using 3-D printing, creating a much smaller footprint and reducing costs.

10 Claims, 11 Drawing Sheets

(58) Field of Classification Search
CPC .......... F28D 7/005; F28D 7/0058; F28D 7/02; F28D 7/024; F28D 7/026; F28D 7/028; F28D 7/04; F28D 7/08; F28D 7/163; F28D 7/1669; F28D 7/1676; F28D 7/1692; F28D 9/04; F28F 27/02; F28F 2210/02; F28F 2210/08; F28F 9/027; F28F 9/0273; F28F 9/0275; F28F 9/0278; H01L 21/67017; H01J 37/32834; H01J 37/32844; B01D 5/0003

See application file for complete search history.

(56) References Cited

U.S. PATENT DOCUMENTS

| | | | | |
|---|---|---|---|---|
| 1,537,553 A | * | 5/1925 | Rushmore | F28D 1/05333 165/110 |
| 1,662,236 A | * | 3/1928 | Coupland | F28D 1/05316 165/174 |
| 1,893,484 A | * | 1/1933 | Belt | F28D 7/04 165/160 |
| 2,762,635 A | * | 9/1956 | Lorber | F22G 3/009 285/131.1 |
| 2,884,092 A | * | 4/1959 | Reindl | F01N 1/08 55/309 |
| 3,335,790 A | * | 8/1967 | Aranyi | F28F 1/36 165/109.1 |
| 3,374,857 A | * | 3/1968 | Hutchins | F01N 3/037 181/244 |
| 3,379,244 A | * | 4/1968 | Gilli | F28D 7/04 165/163 |
| 3,407,575 A | * | 10/1968 | Krizman | B01D 45/16 55/448 |
| 3,941,697 A | * | 3/1976 | Johnson | B01D 35/02 210/167.32 |
| 4,478,606 A | * | 10/1984 | Dorling | B04C 7/00 48/77 |
| 4,815,296 A | | 3/1989 | Amir | |
| 5,000,821 A | * | 3/1991 | Bostjancic | B01D 1/12 159/42 |
| 5,272,874 A | * | 12/1993 | Paas | F01N 3/033 60/297 |
| 5,322,567 A | | 6/1994 | Deaton et al. | |
| 5,820,641 A | * | 10/1998 | Gu | B01D 5/0036 55/434.4 |
| 5,832,994 A | * | 11/1998 | Nomura | F28D 7/005 165/173 |
| 5,867,977 A | * | 2/1999 | Zachary | F02C 7/05 60/39.53 |
| 6,161,575 A | * | 12/2000 | Tseng | C23C 16/4412 118/715 |
| 6,170,568 B1 | | 1/2001 | Valenzuela | |
| 6,599,350 B1 | * | 7/2003 | Rockwell | B01D 45/12 123/519 |
| 7,823,543 B2 | * | 11/2010 | Nomura | F22G 3/007 122/31.1 |
| 9,230,780 B2 | | 1/2016 | Cox et al. | |
| 9,240,308 B2 | | 1/2016 | Cox et al. | |
| 9,543,124 B2 | | 1/2017 | Cox et al. | |
| 9,552,967 B2 | | 1/2017 | Cox et al. | |
| 2002/0134244 A1 | * | 9/2002 | Gu | B01D 8/00 95/267 |
| 2004/0069224 A1 | * | 4/2004 | Lin | C23C 16/4412 118/715 |
| 2004/0251006 A1 | * | 12/2004 | Marin | F28F 1/36 165/157 |
| 2005/0056408 A1 | | 3/2005 | Gregory | |
| 2007/0125528 A1 | * | 6/2007 | Fakheri | F28D 1/0472 165/163 |
| 2015/0251133 A1 | | 9/2015 | Cox et al. | |
| 2015/0252473 A1 | | 9/2015 | Dickinson | |
| 2015/0285567 A1 | * | 10/2015 | Hokazono | B23P 15/26 165/181 |
| 2016/0042916 A1 | | 2/2016 | Wang | |
| 2016/0089630 A1 | | 3/2016 | Dickinson et al. | |
| 2016/0107117 A1 | | 4/2016 | Raj et al. | |
| 2016/0166868 A1 | | 6/2016 | Dickinson | |
| 2016/0169599 A1 | | 6/2016 | Richter et al. | |
| 2016/0276179 A1 | | 9/2016 | Fisher et al. | |
| 2016/0376710 A1 | | 12/2016 | Ho et al. | |
| 2017/0027049 A1 | | 1/2017 | Wang et al. | |
| 2017/0133208 A1 | | 5/2017 | Cox et al. | |
| 2017/0216767 A1 | | 8/2017 | Cox et al. | |
| 2017/0297066 A1 | | 10/2017 | Dickison | |
| 2017/0301524 A1 | | 10/2017 | Cox et al. | |
| 2017/0328653 A1 | * | 11/2017 | O'Coin | F25B 39/00 |
| 2018/0166306 A1 | | 6/2018 | Hou et al. | |
| 2018/0221816 A1 | | 8/2018 | Van Gompel et al. | |
| 2018/0226234 A1 | | 8/2018 | Dickinson | |
| 2018/0337027 A1 | | 11/2018 | L'Heureux et al. | |

FOREIGN PATENT DOCUMENTS

| | | |
|---|---|---|
| CN | 104600188 A | 5/2015 |
| TW | 182318 | 4/1992 |

OTHER PUBLICATIONS

TW Office Action dated Jun. 17, 2021 for Application No. 108142074.

* cited by examiner

HEAT EXCHANGER WITH MULTISTAGED COOLING

CROSS-REFERENCE TO RELATED APPLICATIONS

This application claims priority to U.S. Provisional Patent Application No. 62/779,385, filed Dec. 13, 2018, which is herein incorporated by reference in its entirety.

BACKGROUND

Field

Embodiments described herein generally relate to semiconductor processing equipment and, more particularly, to an abatement system and a heat exchanger for abating compounds produced in semiconductor processes.

Description of the Related Art

Process gases used by semiconductor processing facilities include many compounds, such as perfluorocarbons (PFCs), which must be abated or treated before disposal, due to regulatory requirements and environmental and safety concerns. Typically, a remote plasma source may be coupled to a processing chamber to abate the compounds coming out of the processing chamber. A reagent may be injected into the plasma source to assist the abatement of the compounds.

Conventional abatement technology for abating PFCs utilizes water vapor as a reagent, which provides good destruction removal efficiency (DRE). However, abatement of certain compounds using water vapor in the remote plasma source can result in the formation of solid particles in the remote plasma source due to lower combination reaction time available and equipment downstream of the remote plasma source, such as exhaust lines and pumps. In addition, the exhaust exiting the remote plasma source may be at an elevated temperature, which can cause issues at the pump downstream of the remote plasma source. Existing solutions in the art that attempt to recombine and cool the effluent have been very bulky and inefficient, including having other maintenance issues.

Accordingly, there is a need for an improved abatement system with an effective heat exchanger for abating compounds produced in semiconductor processes.

SUMMARY

One or more embodiments described herein generally provide a heat exchanger for abating compounds produced in semiconductor processes.

In one embodiment, a heat exchanger configured to exchange heat with a flowing effluent includes a coolant inlet; a coolant outlet; and a heat exchanging region disposed between the coolant inlet and the coolant outlet. The heat exchanging region comprises: an outer wall enclosing a central channel region of the heat exchanger; a central channel extending through the central channel region; and a plurality of radial channels extending through a plurality of radial channel regions. Each radial channel region comprising a heat exchanging surface to cool the effluent. The plurality of radial channels extend outwards from the central channel and fluidly couple the central channel to the coolant outlet.

In another embodiment, a heat exchanger configured to exchange heat with a flowing fluid includes a first heat exchanging flange having a central opening that extends through a connection surface of the first heat exchanging flange. The connection surface is parallel to a first plane. The heat exchanger also includes a second heat exchanging flange having a central opening that extends through a connection surface of the second heat exchanging flange. The second heat exchanging flange is disposed a distance in a first direction from the first heat exchanging flange. A heat exchanging region is disposed between the first heat exchanging flange and the second heat exchanging flange. The heat exchanging region comprises an outer wall that is configured to enclose an internal region of the heat exchanger, wherein the outer wall and internal region are disposed between the first heat exchanging flange and the second heat exchanging flange, and the internal region has a central axis. The heat exchanging region also comprises a plurality of channel regions that comprise an outer channel region, a central channel region, and a plurality of radial channel regions. Each of the plurality of channel regions has a heat exchanging surface that is within the internal region. The plurality of radial channel regions are distributed in a radial array about the central axis such that a gap is disposed between each of the plurality of channel radial regions within the radial array. The outer channel region comprises an enclosed outer channel that is disposed between the outer wall and the internal region. The central channel region comprises an enclosed central channel that is positioned at a central position within the internal region. Each of the plurality of radial channel regions comprise an enclosed radial channel that fluidly couples the central channel to the outer region. The plurality of channel regions include at least two radial channel regions that are positioned a distance apart in the first direction.

One or more embodiments described herein also generally relate to methods of forming a heat exchanger.

In one embodiment, a method of forming a heat exchanger that is configured to exchange heat with a flowing fluid includes forming a first mounting flange having a central opening. Forming the first mounting flange comprises sequentially depositing layers of a thermally conductive material on a first surface. A heat exchanging body is formed on the first mounting flange, wherein the heat exchanging body has a heat exchanging section that encloses a heat exchanging region that extends in a direction that is perpendicular to the first surface. Forming the heat exchanging body comprises sequentially depositing layers of the thermally conductive material on a surface of the formed first mounting flange. The sequentially deposited layers disposed within the heat exchanging section each include at least a portion of an outer wall and at least a portion of an inner wall. The outer wall is configured to enclose an internal region of the heat exchanging body, and the internal region has a central axis that is substantially perpendicular to the first surface. A space is formed between the inner wall and the outer wall and a channel region is defined by the space formed between the inner wall and the outer wall. The channel region comprises at least one outer channel region, at least one central channel region, and a plurality of radial channel regions. At least a portion of the heat exchanging surface of the plurality of radial channel regions has an angle relative to the central axis, and an angle of a tangent relative to the central axis at any point is less than or equal to 45 degrees. A second flange is formed on the heat exchanging body, wherein the second flange comprises sequentially depositing layers of a thermally conductive material on the heat exchanging body.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to an abatement system and a heat exchanger for removing unwanted compounds produced in semiconductor processes from the effluent stream. After leaving a plasma zone and entering the heat exchanger, a fluid and a solid effluent recombines and releases a significant amount of energy, leading to a temperature increase of the already hot effluent. To counteract the temperature increase, a cooling mechanism is designed into the heat exchanger. The cooling mechanism includes a plurality of fin structures that have a fluid heat exchanging surface. A coolant can be flowed within a portion of the heat exchanger to cool the walls of the fluid heat exchanging surface via a fluid distribution system. The heat exchanging surface has a curved shaped which creates a multi-stage cross flow path for the hot effluent to flow along as it passes through the heat exchanger. This flow path increases the residence time for the hot effluent to come in contact with the cold walls of the fluid heat exchanging surface, increasing the cooling efficiency of the heat exchanger. Additionally, the flow path ensures the majority of the effluent comes into contact with the walls of the fluid heat exchanging surface, significantly cooling the effluent and preventing it from flowing directly into the vacuum pumps and causing heat damage.

Embodiments described herein also generally relate to methods of forming a heat exchanger. The heat exchanger can be created by sequentially depositing layers of a thermally conductive material on a surface to form one or more walls of the heat exchanger. The sequential deposition includes a first mounting flange formed on a first surface and a heat exchanging body formed on a surface of the formed first mounting flange. A second mounting flange may be formed on a surface of the heat exchanging body. The layers can be deposited by using an additive manufacturing process, such as 3D printing and the like. This provides the advantage of allowing the recombination and staged cooling in much higher efficiency in a much smaller foot print, reducing costs.

Figure 1A:
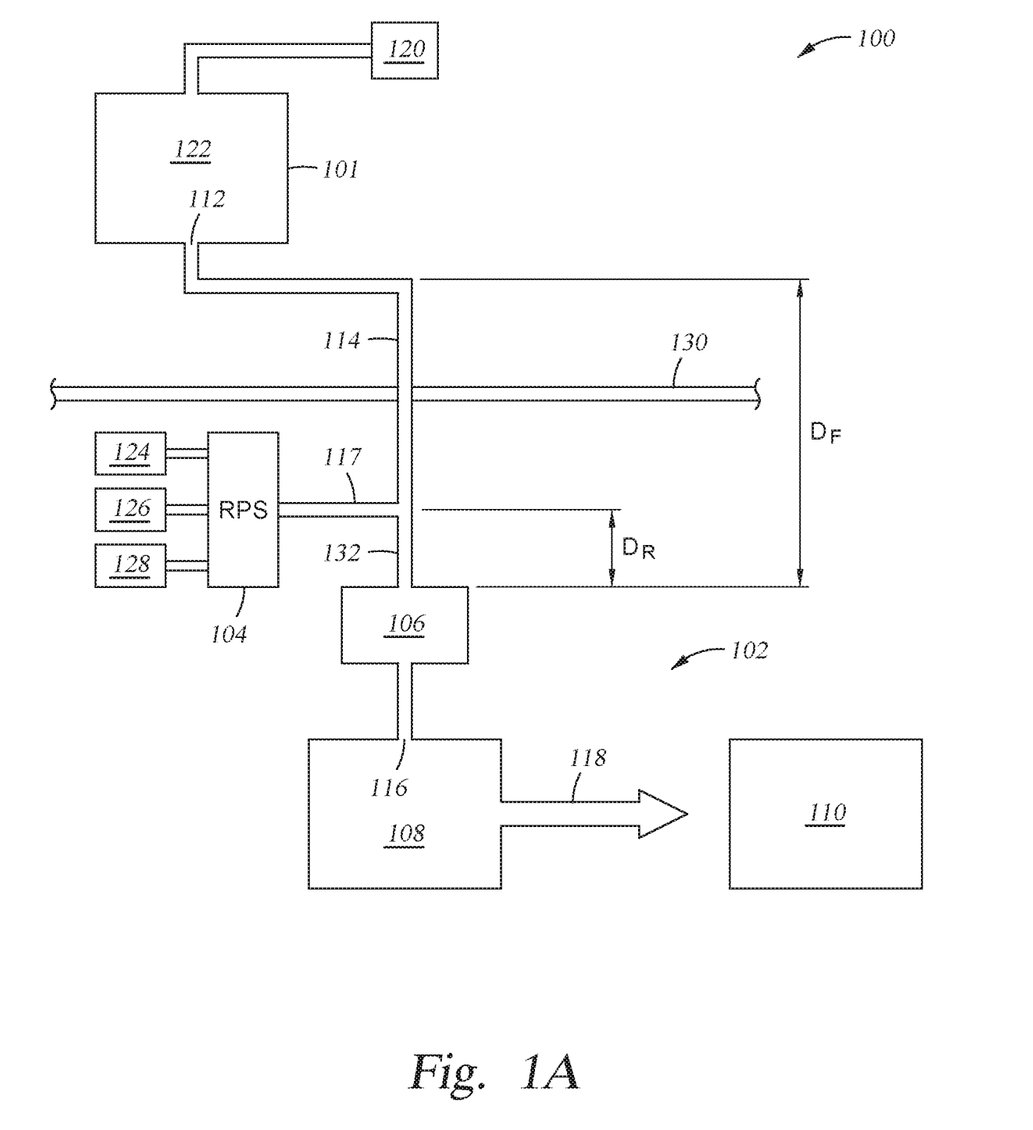
FIG. 1A is a schematic illustration of a processing chamber and abatement system including a remote plasma source and a heat exchanger according to at least one embodiment described herein.

FIG. 1A shows a schematic illustration of a processing system 100 and abatement system 102 including a plasma source 104 and a heat exchanger 106, according to one embodiment described herein. The processing system 100 includes at least a processing chamber 101 and the abatement system 102. The abatement system 102 includes at least the plasma source 104, the heat exchanger 106, and a process vacuum pump 108. The processing chamber 101 is generally configured to perform at least one integrated circuit manufacturing process, such as a deposition process, an etch process, a plasma treatment process, a preclean process, an ion implant process, or another similar integrated circuit manufacturing process. In some embodiments, the processing chamber 101 is configured to process a substrate for display or solar applications. The process performed in the processing chamber 101 may be plasma assisted. For example, the process performed in the processing chamber 101 may be a plasma deposition process for depositing a silicon-based material or a plasma etch process for removing a silicon-based material.

The processing chamber 101 has a chamber exhaust port 112 coupled to the heat exchanger 106 of the abatement system 102 via an exhaust foreline 114. The heat exchanger 106 is coupled to the processing chamber 101 in order to cool the exhaust exiting the plasma source 104 and to collect particles, such as silicon dioxide particles, formed in the exhaust foreline 114 exiting from the processing chamber 101. The heat exchanger 106 is coupled to an exhaust conduit 116 and to a process vacuum pump 108. An exhaust conduit 118 couples the process vacuum pump 108 to a facility exhaust 110. The process vacuum pump 108 is generally utilized to evacuate the processing chamber 101, while the facility exhaust 110 generally includes scrubbers or other exhaust cleaning apparatus for preparing the effluent of the processing chamber 101 to enter the atmosphere.

The heat exchanger 106 is coupled between the processing chamber 101 and the process vacuum pump 108 for reducing the temperature of the exhaust in the exhaust foreline 114 and for collecting particles in the exhaust foreline 114. In one example, the heat exchanger 106 is part of the abatement system 102. The exhaust exiting processing chamber 101 may deposit on cold surfaces (surfaces having a temperature substantially lower than the temperature of the exhaust) inside of the heat exchanger 106. An example of the material that may be collected in the heat exchanger 106 is silicon dioxide, which may be formed in a granular or particulate form.

In some embodiments, the processing chamber 101 includes a remote plasma source 120 for generating cleaning radicals, such as fluorine radicals, that are flowed into the processing region 122 of the processing chamber 101 to clean the processing chamber 101. Unreacted cleaning radicals may exit the processing chamber 101 and enter the exhaust foreline 114 and the heat exchanger 106, removing materials previously deposited in exhaust foreline 114 and the heat exchanger 106 during the integrated circuit manufacturing process. In some embodiments, the cleaning process performed within the processing chamber 101 is performed efficiently, which causes a minimum amount of unreacted cleaning radicals to exit the processing chamber 101 and enter the exhaust foreline 114. A cleaning process that efficiently cleans the processing chamber 101 will generally not provide enough cleaning radicals to effectively clean the heat exchanger 106 during normal use.

Therefore, to assure that enough unreacted cleaning radicals reach and efficiently clean the heat exchanger 106, the abatement system 102 includes the plasma source 104 that may be used to provide a cleaning plasma to clean the heat exchanger 106. The plasma source 104 is utilized to perform an abatement process on gases and/or other materials exiting the processing chamber 101 so that such gases and/or other materials may be subsequently trapped or converted into a more environmentally and/or process equipment friendly composition. The plasma source 104 may be, for example, an inductively coupled plasma source, a capacitively coupled plasma source, a direct current plasma source, or a microwave plasma source. The plasma source 104 may be coupled to the abatement system 102, to ionize, cleaning, purge, carrier, or other process gases, and to provide the ionized gases to the abatement system 102 and to generate cleaning radicals to clean the surfaces and trapped material found in the heat exchanger 106. For example, a first gas supply source 124 may be coupled to the plasma source 104 to provide an inert or non-reactive gas, such as argon (Ar) therethrough to the abatement system 102. A second gas supply source 126 may be coupled to the plasma source 104 to provide a cleaning gas, such as $NF_3$, therethrough to the abatement system 102. Other contemplated cleaning gases can include $NF_2H$, $CHF_3$, $CF_4$, and the like. Additionally, a third gas supply source 128 may be coupled to the plasma source 104 to provide a reactive agent, such as $O_2$, therethrough to the abatement system 102.

The plasma source 104 may be coupled to the exhaust foreline 114 via a conduit 117, as shown in FIG. 1. The reactive gases facilitate the removal of accumulated deposits from the interior of the abatement system 102, thus reducing or eliminating the need for the disassembly of the abatement system 102 for cleaning. In one embodiment, cleaning radicals, such as an $NF_3$ plasma, generated in the plasma source 104, may flow into the exhaust foreline 114 and into the heat exchanger 106 to remove the solid byproduct materials or particles formed or collected in the heat exchanger 106.

In one embodiment, an oxidizing reagent, such as an $O_2$ plasma, generated in the plasma source 104, may be delivered into the exhaust foreline 114 from the plasma source 104 to react with precursor product flowing from the processing chamber 101 to the process vacuum pump 108 during deposition processing. The oxidizing reagent reacts with the precursor byproducts from the deposition process and facilitates the conversion of precursor gas byproduct into solid byproducts or particles to enhance the amount of solid byproduct or particles trapped in the heat exchanger 106. Increasing the amount of solid byproducts trapped in the heat exchanger 106 reduces the amount of reactant byproduct gases that flow through the heat exchanger 106 and into the process vacuum pump 108, exhaust conduit 118, and to the facility exhaust 110, thereby increasing the life expectancy of the process vacuum pump 108 and the exhaust conduit 118, and also reducing the time between maintenance for the process vacuum pump 108 and the exhaust conduit 118 contributing to increased tool uptime.

The heat exchanger 106 may be located a distance $D_F$, such as at least 10-40 feet or more, from the processing chamber 101 in a subfab location of the fabrication facility and may be separated by a wall 130. An outlet of the remote plasma source 104 of the abatement system 102 may flow into the exhaust foreline 114 at a location 132 in the exhaust foreline 114 that is substantially adjacent to an entrance of the heat exchanger 106. In one example, the location 132 is positioned a distance DR before the exhaust foreline 114 enters the heat exchanger 106, such as a distance of between 6 and 18 inches, or about 12 inches. It has been found the heat exchanger 106 captures more solid byproduct material when an $O_2$ plasma, generated by the plasma source 104, is introduced into the exhaust foreline 114 at a distance DR, between 6 and 18 inches, from the entrance to the heat exchanger 106.

The exhaust conduit 118 allows gases to flow from the process vacuum pump 108 to the facility exhaust 110. The exhaust foreline 114, exhaust conduit 116, process vacuum pump 108, exhaust conduit 118, and associated hardware may be formed from one or more process-compatible materials, such as aluminum, anodized aluminum, nickel plated aluminum, stainless steel, and combinations and alloys thereof, for example. The heat exchanger 106 may be formed of similar process-compatible materials, or made of materials conducive to condensation of the exhaust gases, for example. The facility exhaust 110 may be a burn/wet abatement subsystem, as is known in the semiconductor fabrication industry, for example.

The abatement system 102 may be provided in a separate location from the processing chamber 101 within the fabrication facility and separated from the processing chamber 101 by the wall 130. The separation of the abatement system 102 from the processing chamber 101 allows for maintenance of the abatement system in an environment that does not require as stringent clean room air purity class requirements.

Figure 1B:
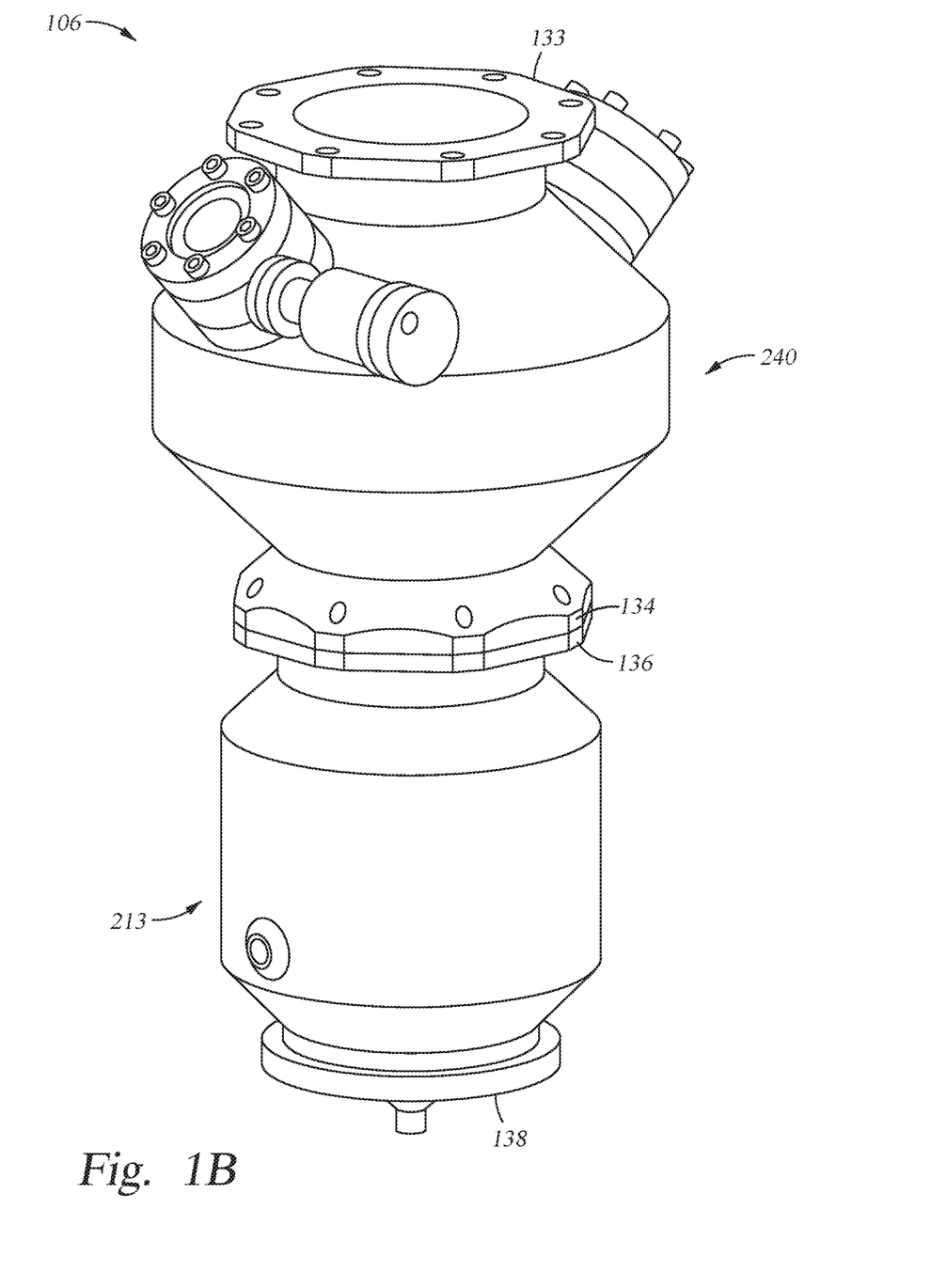
FIG. 1B is a perspective view of at least one embodiment of the heat exchanger of FIG. 1A.

FIG. 1B is a perspective view of at least one embodiment of the heat exchanger 106 of FIG. 1A. The heat exchanger 106 includes a hot trap region 240 and a heat exchanging region 213. The hot trap region 240 can be detachable from the heat exchanging region 213. The heat exchanger 106 includes a first hot trap flange 133, a second hot trap flange 134, a first heat exchanging flange 136, and a second heat exchanging flange 138. The first hot trap flange 133 is located at the top of the hot trap region 240. The first hot trap flange 133 can couple the heat exchanger 106 to the location 132, where the hot effluent can enter the heat exchanger 106.

The second hot trap flange 134 is located at the bottom of the hot trap region 240 and is coupled to the first heat exchanging flange 136, located at the top of the heat exchanging region 213. The second heat exchanging flange 138 is located at the bottom of the heat exchanging region 213. The second heat exchanging flange 138 can couple the heat exchanger 106 to the vacuum pump 108, where the hot effluent can exit the heat exchanger 106.

Figure 2A:
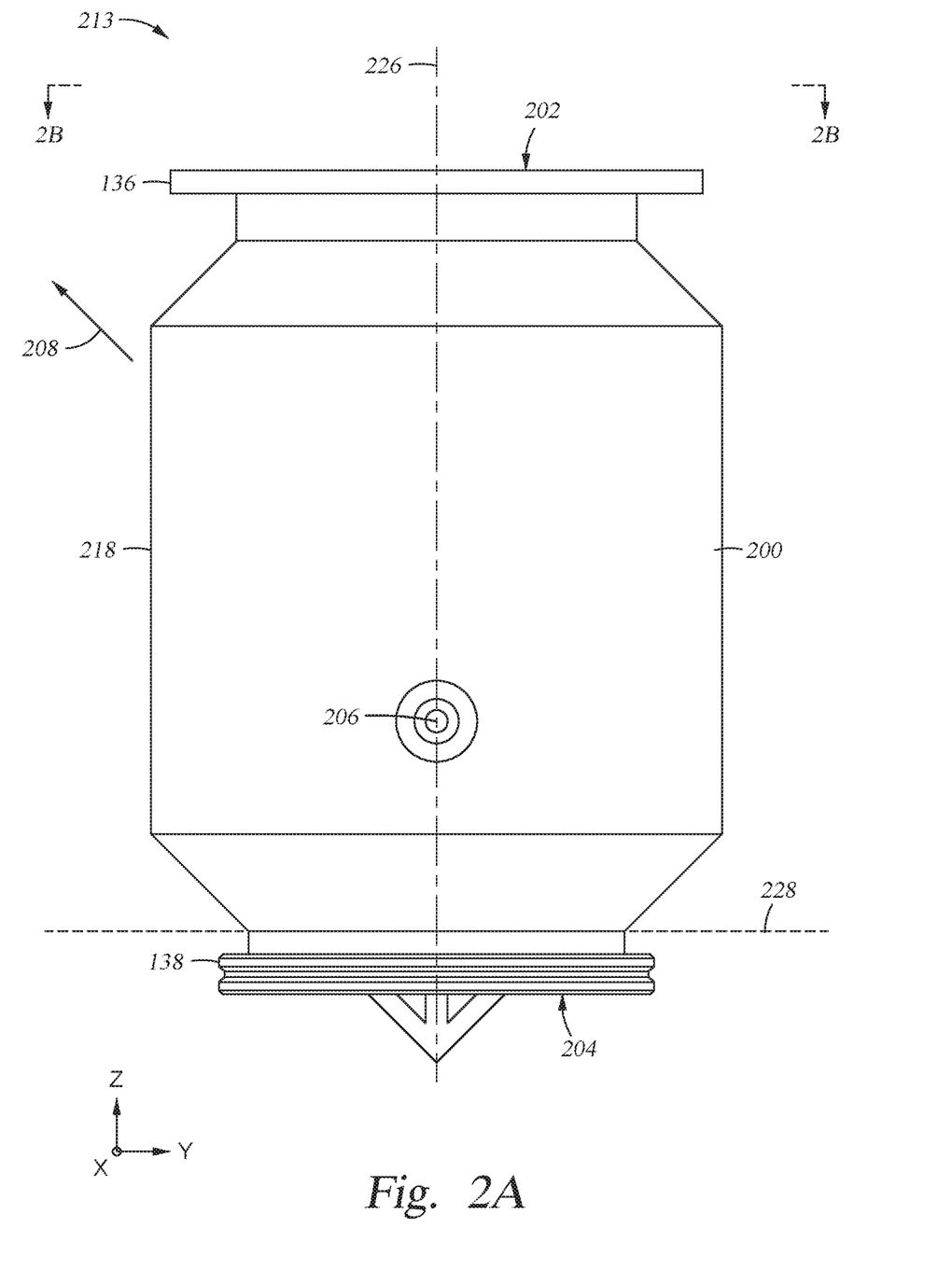
FIG. 2A is a schematic side view of at least one embodiment of the heat exchanging region of FIG. 1B.
Figure 2B:
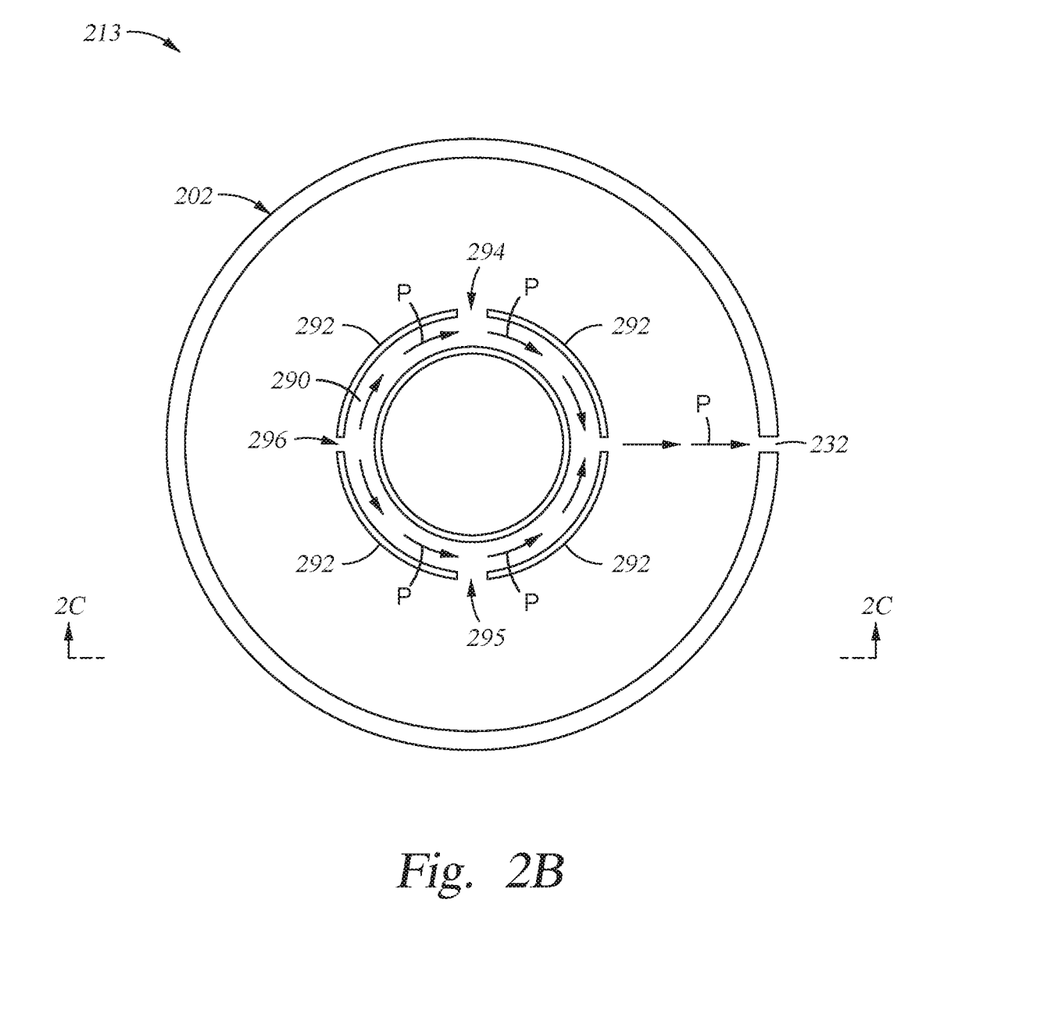
FIG. 2B is a top view of at least one embodiment of the heat exchanging region that is viewed from a horizontal plane (X-Y plane) coincident with line 2B-2B shown in FIG. 2A.
Figure 2C:
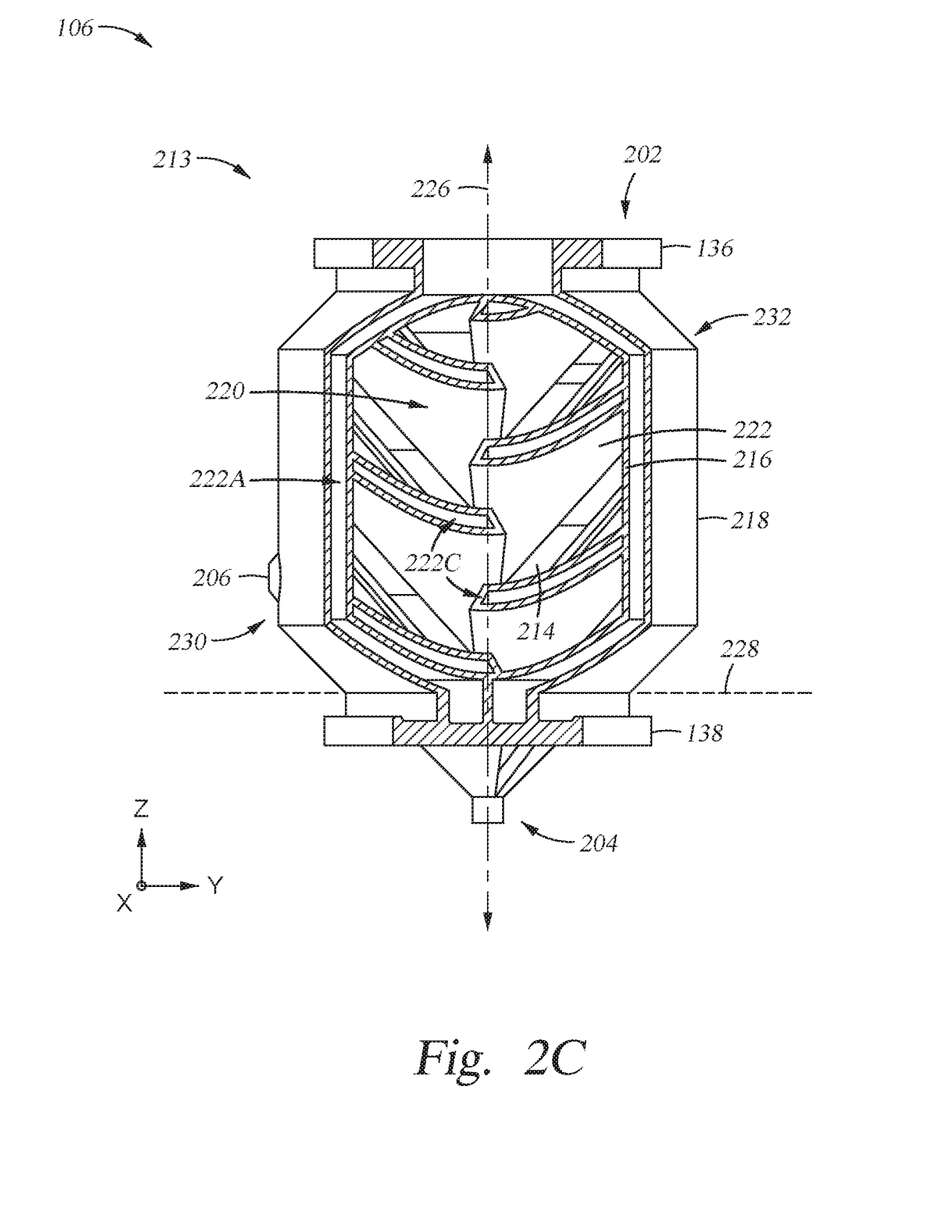
FIG. 2C is a schematic side partial cross-sectional view of at least one embodiment of the heat exchanging region that is sectioned using line 2C-2C shown in FIG. 2B.

FIGS. 2A-2C show schematic top, and cross-sectional views of at least one embodiment of the heat exchanging region 213 of FIG. 1B. As shown in FIG. 2A, the heat exchanging region 213 includes a heat exchanging body 200, a top 202, a bottom 204 opposite the top 202, an inlet port 206, and an outlet port 208 opposite the inlet port 206. FIG. 2B is a top view of the heat exchanging region 213, which is viewed from a horizontal plane (X-Y plane) coincident with line 2B-2B shown in FIG. 2A. FIG. 2C is a schematic side cross-sectional view of the heat exchanging region 213 that is sectioned using line 2C-2C shown in FIG. 2B.

In one embodiment, which can be combined with any other embodiments herein, the heat exchanging body 200 may be cylindrical, as shown in FIG. 2A, or any other suitable shape. The heat exchanging body 200 can have a diameter between 150 and 200 mm, although other diameters are also possible. The top 202 includes the first heat exchanging flange 136 and the bottom 204 includes the second heat exchanging flange 138. The first heat exchanging flange 136 and the second heat exchanging flange 138 are coupled to the heat exchanging body 200 via connection surfaces, the connection surfaces being parallel to a central axis 226. The heat exchanging body 200 extends from the first heat exchanging flange 136 to the second heat exchanging flange 138 such that the second heat exchanging flange 138 is disposed a distance from the first heat exchanging flange 136. This distance can be between 200 and 250 mm, however other distances are also possible. The heat exchanging body 200 comprises an outer wall 218 configured to enclose an internal region 220 of the heat exchanging region 213, and each of the outer wall 218 and internal region 220 extend from the first heat exchanging flange 136 to the second heat exchanging flange 138. For reference, a plane 228 is defined as being oriented substantially perpendicular to the central axis 226.

The heat exchanging region 213 includes a channel region 222 that is defined by a space formed between an inner wall 216 and the outer wall 218. A coolant may be flowed (e.g., coolant is represented by the reference arrows P in FIG. 2D) through the channel region 222 and against a heat exchanging surface 214 of each of the channel regions 222 positioned within the internal region 220. The coolant is flowed into the heat exchanging region 213 via a coolant inlet 230. Once entering the heat exchanging region 213, the coolant is flowed through a fluid distribution system 282 (FIG. 2E), which is described in more detail below. The coolant inlet 230 is located toward the bottom of the heat exchanging body 200 and a coolant outlet 232 is located toward the top of the heat exchanging body 200. As such, the coolant is made to flow from the bottom to the top of the heat exchanging body 200 and is drained from the top of the heat exchanger 106.

Figure 2D:
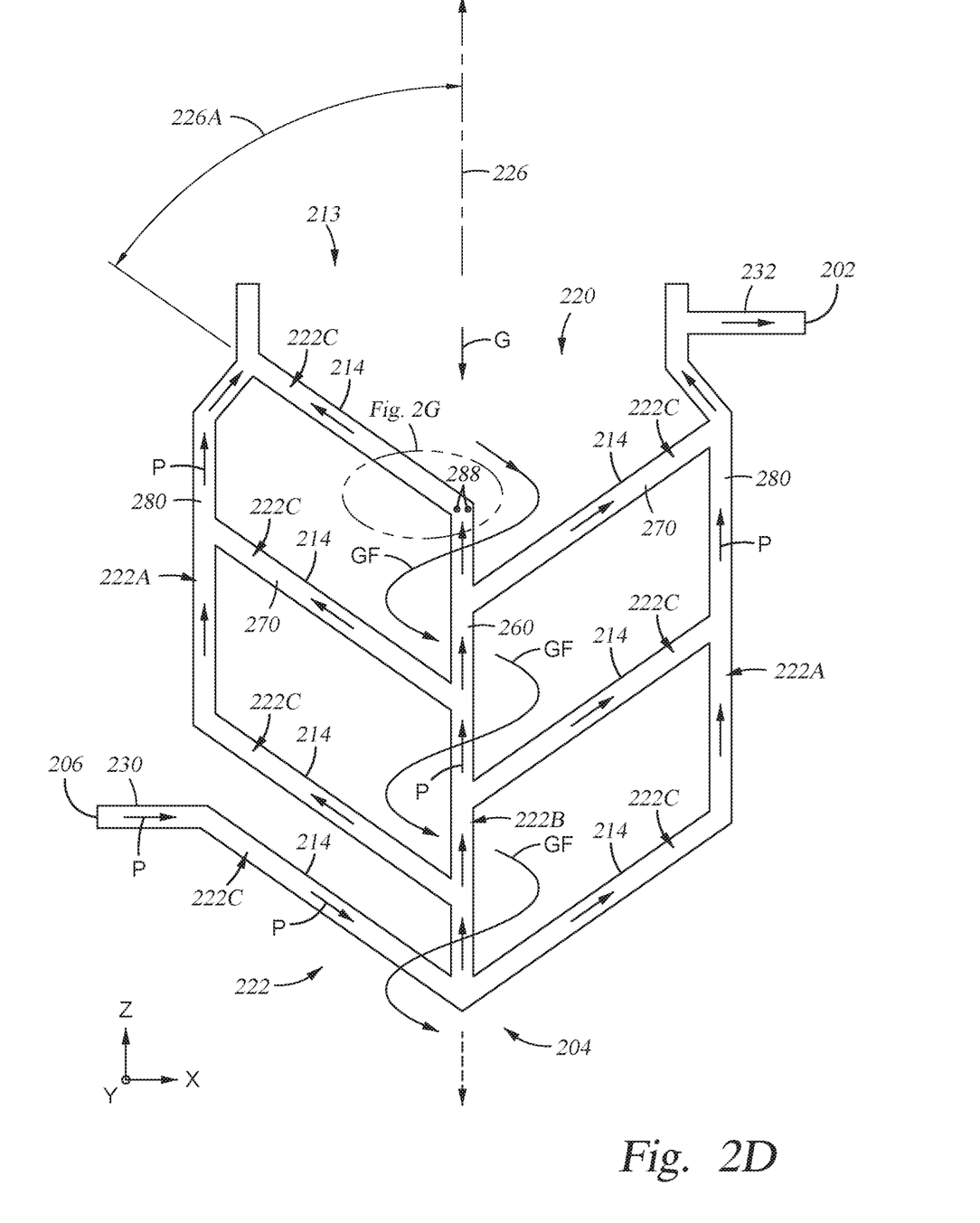
FIG. 2D is a schematic cross-sectional view of at least one embodiment of the cooling region of FIG. 2C.

FIG. 2D is a schematic cross-sectional view of at least one configuration of the internal portions of the channel regions 222 of FIG. 2C. One will note that the angular orientation of the channel regions 222 relative to central axis 226 has been rotated about the central axis 226 so that an internal portion of at least one of the channel regions 222 at each vertical level (e.g., Z-direction) is shown on the page of FIG. 2D. The channel regions 222 within the internal region 220 can be classified into at least three different structural types that include an outer channel region 222A, a central channel region 222B, and radial channel regions 222C. The outer channel region 222A generally includes an enclosed outer channel 280 that is positioned at the outer extent of the internal region 220, and is typically coincident with the outer wall 218 of the heat exchanger 106, as shown in FIG. 2C. The outer channel 280 can be an opening, such as a tube, that allows coolant to pass through. The central channel region 222B generally includes an enclosed central channel 260 that is positioned in the center of the internal region 220. The central channel 260, like the outer channel 280, can be an opening, such as a tube, that allows coolant to pass through.

The radial channel regions 222C include a series of wedge shaped enclosed radial channels 270 that are distributed about the central axis that are also distributed vertically into at least two different levels. The radial channels 270 can be openings, such as tubes, that allow coolant to pass through. The radial channels 270 fluidly couple the central channel 260 to the outer channel 280. As shown in FIGS. 2C and 2D, the radial channel regions 222C are distributed into five different levels that are spaced apart in the central axis 226 direction (e.g., Z-direction). FIG. 2F illustrates an example of an internal region 220 that includes at least six levels of central channel regions 222B, wherein each level includes at least three radial channel regions 222C that are symmetrically distributed about the central axis 226 so that a gap 229 is disposed between each adjacent radial channel region 222C within each level.

Figure 2E:
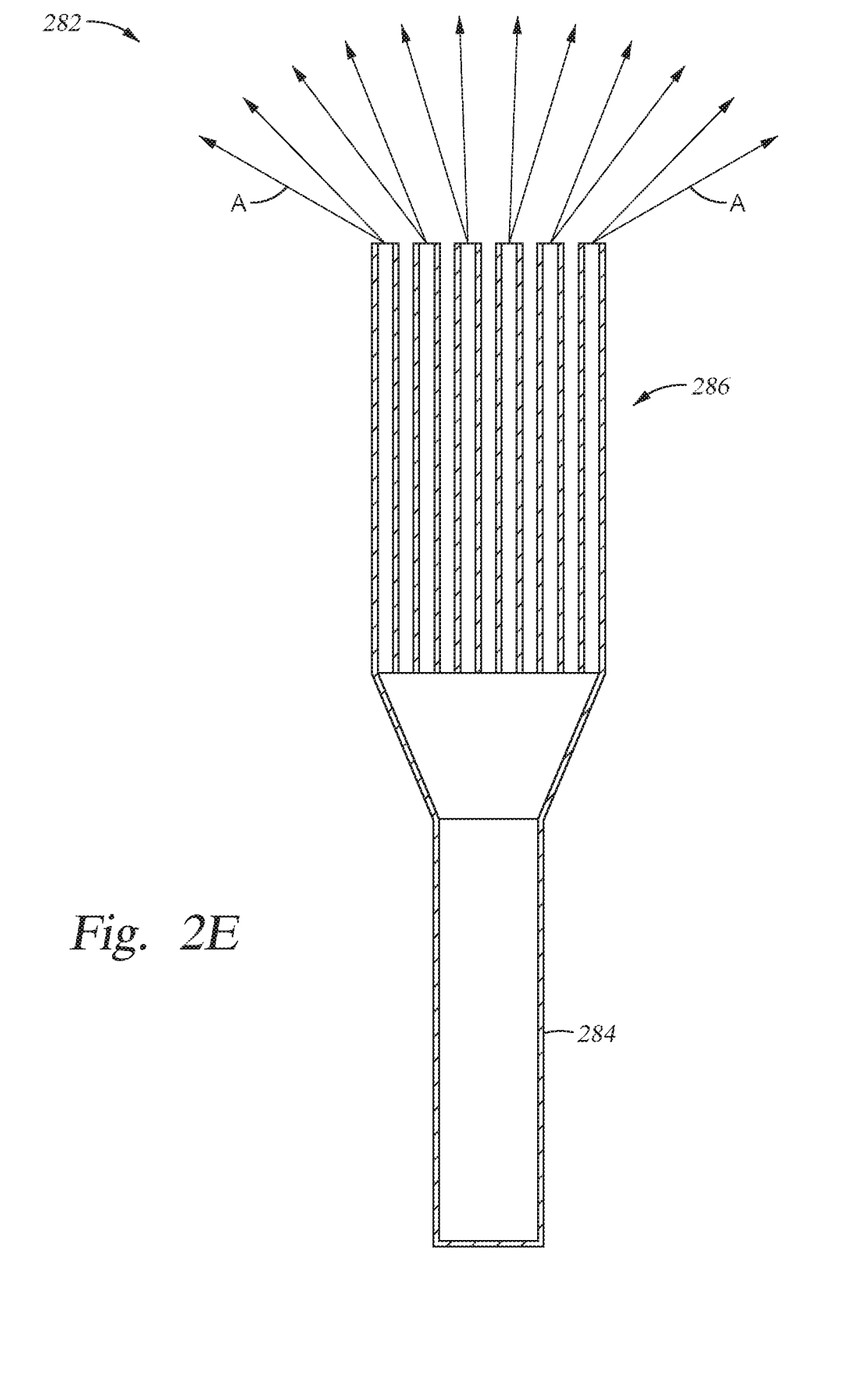
FIG. 2E is a schematic side view of a fluid distribution system according to at least one embodiment described herein.
Figure 2F:
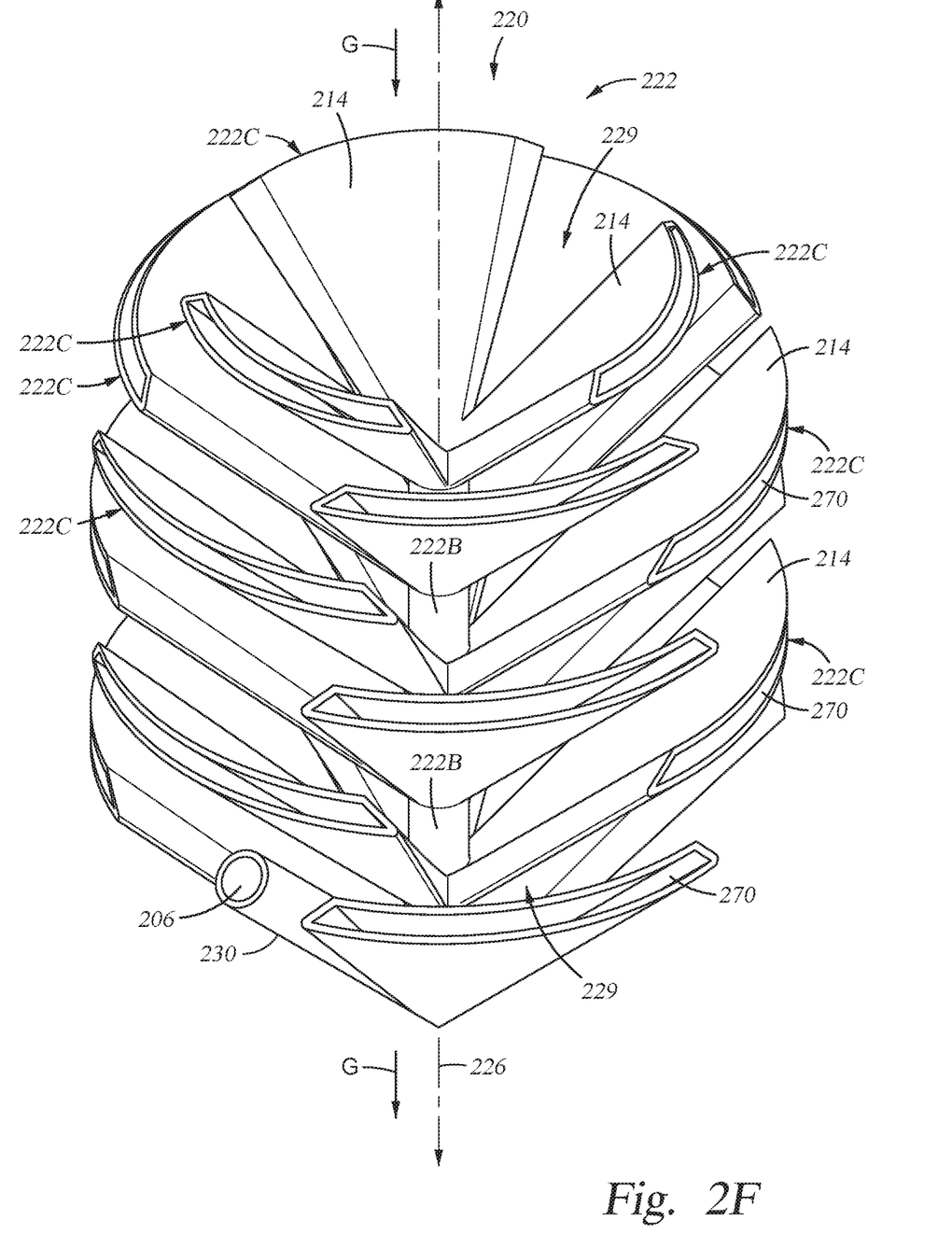
FIG. 2F is an isometric view of a portion of the channel regions positioned within the internal region of the cooling region of FIG. 2C.

FIG. 2E is a schematic side view of the fluid distribution system 282 according to at least one embodiment described herein. In some embodiments, during operation, a coolant flows from the bottom 204 (FIG. 2D) of the heat exchanging region 213 to the top 202 of the heat exchanging region 213 via the fluid distribution system 282 due to a buoyancy force created by the exchange of heat from a flow of a hot effluent (See flow path G in FIG. 2D) through the internal region 220 to a heat exchanging coolant that is heated by the hot effluent. The fluid distribution system 282 includes a diffuser 284 and a plurality of fluid channels 286. In some embodiments, the coolant enters the heat exchanging system 213 via the coolant inlet 230. Following entering the coolant inlet 230, the coolant flows into the diffuser 284. The diffuser 284 provides uniform flow upwards for the coolant. After flowing a distance upwards within the diffuser 284, the coolant flows and is divided into the plurality of fluid channels 286. In some embodiments, the plurality of fluid channels 286 include six fluid channels (as shown in FIG. 2E), however in other embodiments, any number of fluid channels can be used in the fluid distribution system 282. Each fluid channel 286 distributes coolant to two of the central channel 260, the outer channel 280, and radial channels 270 as shown by the arrows, A, in FIG. 2E. Therefore, in the embodiments shown in FIG. 2E, the six fluid channels 286 distribute the coolant to each of the central channel 260, the outer channel 280, and the radial channels 270, distributing the coolant to 12 total channels overall. However, in other embodiments, each of the fluid channels 286 may distribute the coolant to one channel, three channels, or any other number of channels. Two apertures 288 (FIG. 2D) allow for air flow into the central channel 260, pushing the coolant downwards and counteracting the upwards buoyancy force. As such, the apertures 288 help the coolant flow into all of the radial channels 270 instead of directly upwards to the coolant outlet 232 via the path of least resistance (such as only through the upwards radial channels 270 or through the outer channel 280). Therefore, the coolant flow is distributed more evenly through the heat exchanging region 213.

After the coolant flows through the each of the central channel 260, the outer channel 280, and the radial channels 270, the coolant flows into a zone 290 (FIG. 2B) via a first opening 294, a second opening 295, and a third opening 296. The coolant flow is shown by the arrows, represented by P in FIG. 2B. Each of the first opening 294, the second opening 295, and the third opening 296 assures that the coolant flowing from each of the central channel 260, the outer channel 280, and the radial channels 270 takes the same distance to flow to the coolant outlet 232, allowing an even distribution of coolant to all parts of the heat exchanging region 213. Barriers 292 block the coolant from flowing into the zone 290 from all directions, assuring the coolant flows into the zone 290 via the first opening 294, the second opening 295, and the third opening 296, aiding the even distribution of coolant flow. In some embodiments, the first opening 294 and the second opening 295 are each larger than the third opening 296. As such, the majority of the coolant flows into the zone 290 via the first opening 294 and the second opening 295. The smaller third opening 296 aids in the coolant movement through the zone 290 where it thereafter exits the heat exchanging region 213 via the coolant outlet 232. A gradient, represented by $G_R$ in FIG. 2H, on a top inner surface 298, aids the flow of coolant from the zone 290 to the coolant outlet 232. In some embodiments, the angle of the gradient can be about 1 degree. However, in other embodiments, the angle of the gradient can be other small angles that aid the flow of coolant to the coolant outlet 232. In these embodiments, the fluid distribution system 282 advantageously provides for uniform fluid distribution throughout the heat exchanging region 213, leading to more uniform cooling among the heat exchanging surfaces 214. As such, as the hot effluent flows downwards through the heat exchanging region 213 and comes in contact with the heat exchanging surfaces 214, it cools more quickly and uniformly before exiting the heat exchanging region 213.

As schematically shown in FIG. 2D, the hot effluent flows from the top 202 of the heat exchanging region 213 to the bottom 204 of the heat exchanging region 213, heating the lower temperature incoming coolant injected at the bottom of the heat exchanging region 213. The hot effluent causes the density of the coolant (e.g., water) to decrease as it is heated from the incoming inlet temperature and therefore flows upward within the heat exchanging region 213, creating a suction at the coolant inlet 230. The open area of the coolant inlet 230 can be the same as the area of the inlet port 206, minimizing the pressure drop from the inlet port 206 to the outlet port 208. The heat exchanging surfaces 214 of the channel regions 222 acts to cool the hot effluent flowing through the fluid heat exchanging region 213, preventing heat damage to the process vacuum pump 108. The heat exchanging region 213 can also include a thermistor (not shown) proximate the inlet port 206 which can be used to measure the temperature near the bottom of the heat exchanging region 213. This provides the advantage of allowing a user to monitor the temperature of the hot effluent during the process before it flows into the process vacuum pump 108.

Figure 2G:
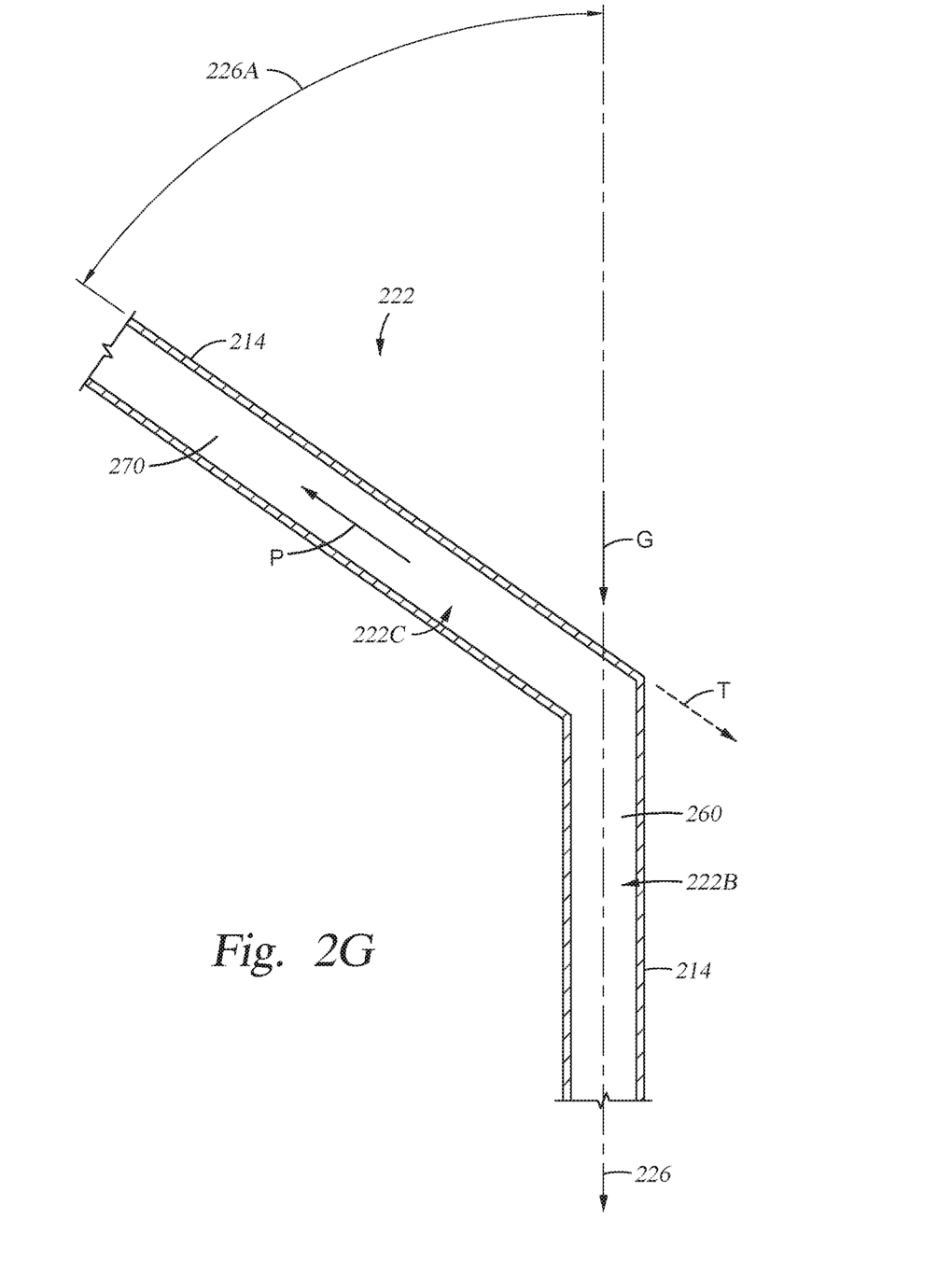
FIG. 2G is a close-up schematic cross-sectional view of a portion of the cooling region illustrated in FIG. 2D.

Reference arrows G in FIGS. 2D, 2F, and 2G illustrate the flow direction of the hot effluent through the heat exchanging region 213. FIG. 2D further illustrates the flow path "GF" of the hot effluent, which impinges and contacts the heat exchanging surfaces 214 of the channel regions 222. The heat exchanging surface 214 can be separate angled surfaces as shown in FIGS. 2C, 2D, 2F, and 2G, the angled surfaces being formed at an angle 226A to the central axis 226 (FIGS. 2C-2D). However, the heat exchanging surface 214 can also include a curved surface. In one example, as illustrated in FIG. 2F, the radial channel regions 222C include a radially varying curvature, which has a center point that is coincident with the central axis 226. In some embodiments, the curvature of the radial channel regions 222C can vary proportionally by the distance within a horizontal plane (X-Y plane) that the heat exchanging surface 214 of the radial channel regions 222C extends away from the central axis 226. As shown in FIG. 2F, for example, the curved upper surface of each of the radial channel regions 222C extend linearly away from the central axis 226, based on the angle 226A, as Z-direction height increases.

Referring to FIG. 2G, which is a close up view of a portion of a radial channel region 222C and a central channel region 222B shown in FIG. 2C, a tangent at any point on the heat exchanging surface 214 has an angle, 226A, relative to the central axis 226 that can be less than or equal to 45 degrees. In one example, as shown in FIG. 2G, the tangent T of the heat exchanging surface 214 has an angle relative to the central axis (i.e., parallel to the Z axis) that is less than 45 degrees when the channel regions 222 are formed by an additive manufacturing process and the channel regions 222 are formed from a stainless steel material. In other embodiments, when stainless steel is not used, the angle, 226A, can be less than or equal to 60 degrees or 70 degrees relative to the central axis 226 depending on the method of manufacturing and material used. If aluminum is used as a material, the angle, 226A, can be less than or equal to 30 degrees relative to the central axis 226. The reference arrows G show a multi stage cross flow path that increases the residence time of the hot effluent as it hits the cold walls of the fluid heat exchanging surfaces 214, thereby increasing cooling efficiency. In addition, by forming the fluid heat exchanging surfaces 214 so that they include separate angled surfaces, this configuration can be used to ensure that no part of the hot effluent will miss the fluid heat exchanging surface 214 of the inner wall 216, to cool the hot effluent to prevent the hot effluent from damaging the process vacuum pump 108 and/or other structures downstream. The temperature of the walls of the fluid heat exchanging surface 214 can range from 20 to 50 degrees Celsius, cooling the hot effluent to be within that temperature range by the time it exits into the process vacuum pump 108.

Figure 2H:
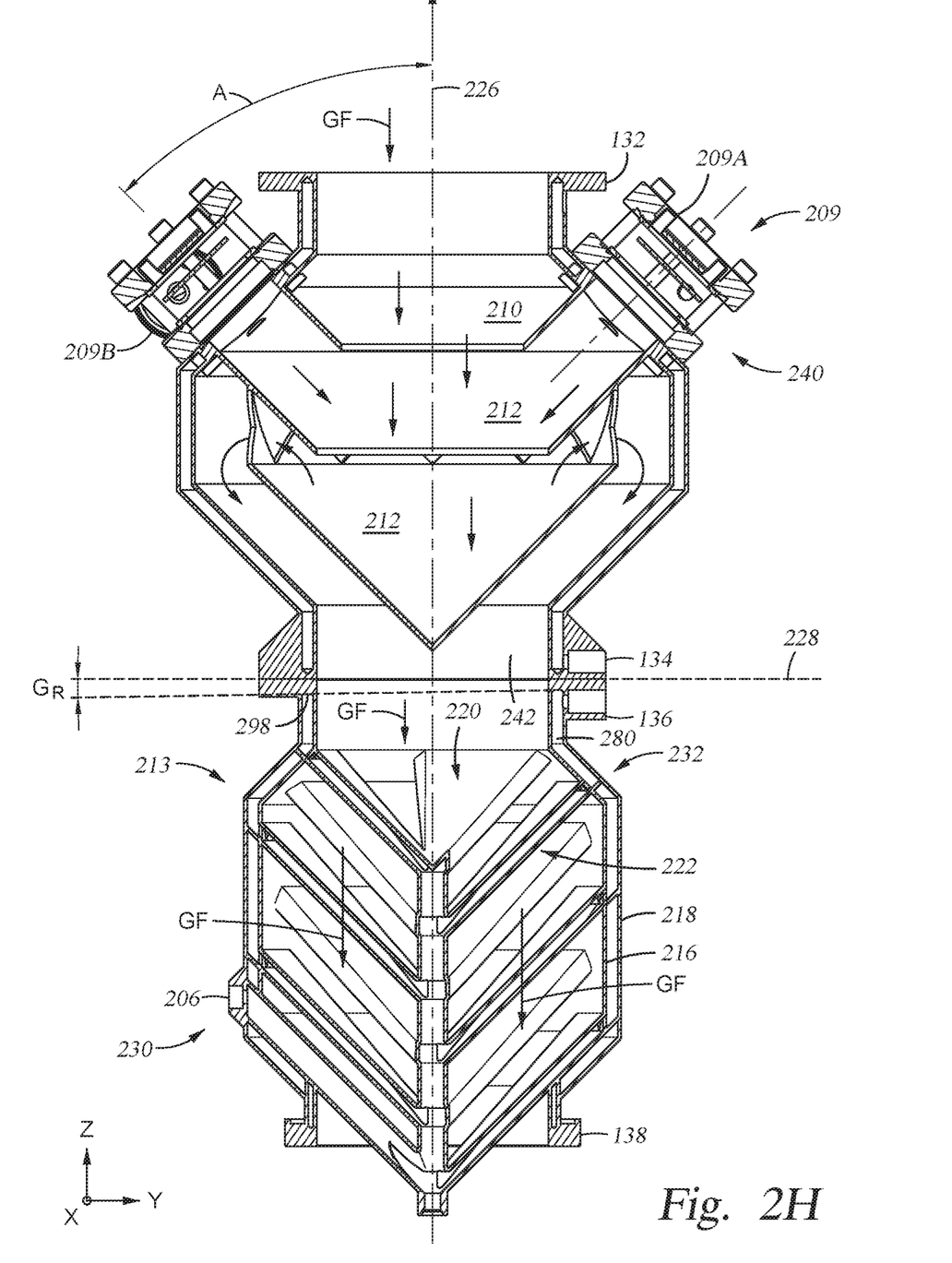
FIG. 2H is a schematic cross-sectional view of at least one embodiment of the heat exchanger of FIG. 1B.

FIG. 2H is a schematic cross-sectional view of the heat exchanger 106 of FIG. 1B according to at least one embodiment. This configuration is similar to the configuration shown in FIG. 2C, except that it includes the hot trap region 240. As mentioned above, in some embodiments, the hot trap region 240 can be detachable from the heat exchanging region 213. However, in other embodiments, the hot trap region 240 and the heat exchanging region 213 can be one unitary piece (as shown in FIG. 2H). The hot trap region 240 includes at least one view port (two shown) 209, a deflector 210, and at least one cone tray 212 (three shown). The view ports 209 include a clamp 209A that is used to seal a window 209B against a portion of the outer wall 218. This can allow a user positioned outside the heat exchanger 106 to look inside the heat exchanging body 200 to view particles collected in the cone trays 212. The cone trays 212 are designed to trap and isolate the maximum number of particles entering the heat exchanger 106 during a processing chamber 101 processing sequence. The deflector 210 is designed to deflect some of the clean gas so that the gas will interact with and react with the solid deposits, improving cleaning efficiency. The deflector 210 can be designed with an integrated lip to allow the particles to fall on the cone trays 212.

After exiting the plasma source 104, hot effluent recombines when entering the heat exchanger 106. The recombination typically occurs when the hot effluent enters the hot trap region 240 and recombines in the hot trap region 240. This recombination reaction releases a significant amount of energy, causing the temperature of the already hot effluent to increase. Additionally, the recombination prevents solid and liquid particles from getting into the heat exchanging region 213. Instead, the solid and liquid particles have enough time to become gaseous molecules before entering the heat exchanging region 213. The hot trap region 240 is designed such that it prevents the hot effluent from rising to the top of heat exchanger 106. As such, the hot trap region 240 prevents the clouding of the viewports 209, allowing a user to look and see the inside of the heat exchanger 106 clearly. Thereafter, the hot effluent flows past the bottom plate 242 from the hot trap region 240 into the heat exchanging region 213. Therefore, the heat exchanging region 213 takes on the temperature of the hot effluent, and can range from 400 to 800 degrees Celsius.

Figure 3:
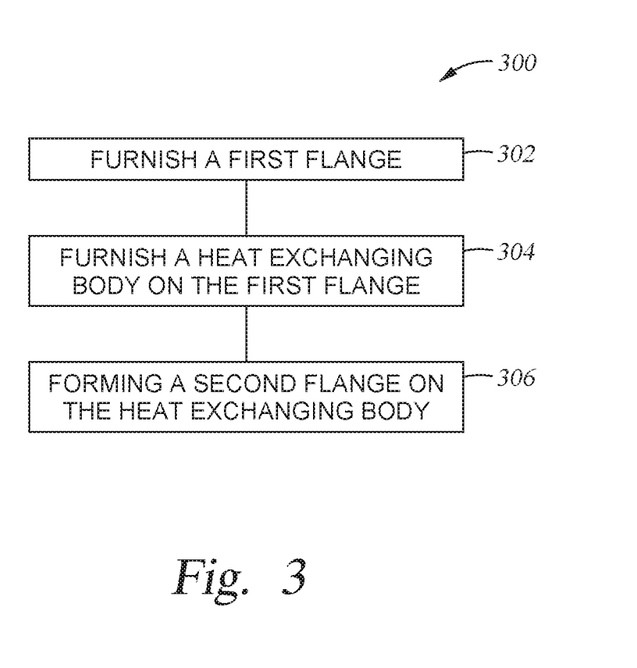
FIG. 3 is a flow chart of a method for forming the heat exchanger according to at least one embodiment described herein.

FIG. 3 shows a flow chart of a method 300 for forming the heat exchanger according to at least one embodiment described herein. The method 300 of forming a heat exchanger that is configured to exchange heat with a flowing fluid. The layers can be deposited by using an additive manufacturing process, such as 3D printing process and the like. This provides the advantage of allowing the recombination and staged cooling in much higher efficiency in a much smaller footprint, reducing costs. The stages can be extended depending on the cooling required.

More specifically, in some embodiments, the construction of a heat exchanger begins by creating a CAD model of the three dimensional version of the heat exchanger. This can be done through the use of existing CAD design software, such as Unigraphics or other similar software. An output file, which is generated by the modelling software, is then loaded to an analysis program to ensure that the heat exchanger design meets the design requirements (e.g., gas tight, angular orientation of the curvature of the heat exchanging surface, mass density). The output file is then rendered, and the 3D model is then "sliced" into a series of 2D data bitmaps, or pixel charts. The 2D bitmaps, or pixel charts, are used to define the locations across an X and Y plane where the layers in the heat exchanger will be built. In this configuration, the additive manufacturing process will use these locations to define where a laser will be applied to form the desired layer features.

The coordinates found in the pixel charts are used to define the location at which laser energy will be focused. Every coordinate for an X and Y location and a given heat exchanger supporting Z stage position will be defined based on the pixel charts. Each X, Y and Z location will include either a laser energy delivery or non-delivery condition. By combining the pixel charts in each formed layer, a heat exchanger of a desirable shape and structural configuration can be printed by the positioning of the laser energy in a desirable pattern across the layer. This process can be used to perform each of the blocks described below.

In block 302, a first heat exchanging flange is formed having a central opening. The first heat exchanging flange can be formed by sequentially depositing layers of a material on a first surface.

In block 304, a heat exchanging body is formed on the first heat exchanging flange. The heat exchanging body has a heat exchanging section that encloses a fluid heat exchanging region that extends in a direction that is perpendicular to the first surface. The heat exchanging body can be formed by sequentially depositing layers of the thermally conductive material on a surface of the formed first heat exchanging flange. In some embodiments, the conductive material includes a metal (e.g., Ti, Ni, Fe), a metal alloy (e.g., SST), a thermally conductive ceramic material (e.g., AlN, AlO$_x$, BN), or other thermally conductive material that is inert to the effluent materials. Typically, the conductive material is a non-magnesium containing metal. The sequentially deposited layers disposed within the heat exchanging section can each include at least a portion of an outer wall and at least a portion of an inner wall. The outer wall can be configured to enclose an internal region of the heat exchanging body, and the internal region has a central axis that is substantially perpendicular to the first surface. The inner wall can be disposed within the internal region, and positioned to isolate the heat exchanging region from an outer region of the internal region. A channel region can be defined by a space formed between the inner wall and the outer wall. The channel region can include an outer region, a central region, and a radial region. The channel region can have a heat exchanging surface that is within the heat exchanging region, wherein at least a portion of the heat exchanging surface of the radial region of the channel region may have an angle relative to the central axis, and a tangent of the angle relative to the central axis at any point is less than or equal to 70 degrees, 60 degrees, 45 degrees, 30 degrees, or 20 degrees. However, other angles are also possible. In one example, referring to FIGS. 2A-2G, a tangent of a heat exchanging surface 214 of a radial channel region 222C at any point is less than or equal to 45 degrees, 30 degrees, or 20 degrees to the central axis.

In block 306, a second heat exchanging flange is formed on the heat exchanging body. The second heat exchanging flange can be formed by sequentially depositing layers of a material on the heat exchanging body. The heat exchanging body can have a diameter between 150 and 200 mm, however the diameter can be other lengths. The distance between the first heat exchanging flange and the second heat exchanging flange can be between 200 and 250 mm, although other distances are possible.

While the foregoing is directed to embodiments of the present disclosure, other and further embodiments of the disclosure may be devised without departing from the basic scope thereof, and the scope thereof is determined by the claims that follow.

I claim:

1. A heat exchanger configured to exchange heat with a flowing fluid, comprising:
   a first heat exchanging flange having a central opening that extends through a connection surface of the first heat exchanging flange, wherein the connection surface is parallel to a first plane;
   a second heat exchanging flange having a central opening that extends through a connection surface of the second heat exchanging flange, wherein the second heat exchanging flange is disposed at a distance in a first direction from the first heat exchanging flange;
   a heat exchanging region disposed between the first heat exchanging flange and the second heat exchanging flange, wherein the heat exchanging region comprises:
      an outer wall that is configured to enclose an internal region of the heat exchanger, wherein the outer wall and the internal region are disposed between the first heat exchanging flange and the second heat exchanging flange, and the internal region has a central axis; and a plurality of channel regions that comprise an outer channel region, a central channel region, and a plurality of radial channel regions, wherein:

each of the plurality of channel regions has a heat exchanging surface that is within the internal region;

the plurality of radial channel regions are distributed in a radial array about the central axis such that a gap is disposed between each of the plurality of channel radial regions within the radial array, wherein an angle of a tangent formed at any point on the heat exchanging surface of each of the plurality of channel regions relative to the central axis is less than or equal to 70 degrees;

the outer channel region comprises an enclosed outer channel that is disposed between the outer wall and the internal region;

the central channel region comprises an enclosed central channel that is positioned at a central position within the internal region;

each of the plurality of radial channel regions comprises an enclosed radial channel that fluidly couples the central channel to the outer channel; and the plurality of channel regions include at least two radial channel regions that are positioned a distance apart in the first direction.

2. The heat exchanger of claim 1, further comprising a coolant inlet that is coupled to the central channel region, wherein the coolant inlet has an opening that is disposed at a position closer to the second heat exchanging flange than the first heat exchanging flange.

3. The heat exchanger of claim 2, further comprising a coolant outlet that is coupled to the outer channel region, wherein the coolant outlet has an opening that is disposed at a position closer to the first heat exchanging flange than the second heat exchanging flange.

4. The heat exchanger of claim 3, further comprising a fluid distribution system extending from the coolant inlet to the coolant outlet.

5. The heat exchanger of claim 4, wherein the fluid distribution system comprises a plurality of fluid channels, each of the plurality of fluid channels configured to distribute coolant to any two of the central channel, the outer channel, and the plurality of radial channels.

6. The heat exchanger of claim 1, further comprising a detachable hot trap region including at least one cone tray configured to collect particles passing through the heat exchanger.

7. The heat exchanger of claim 6, further comprising a deflector configured to deflect gases passing through the heat exchanger.

8. The heat exchanger of claim 6, further comprising a view port having an opening that extends through the outer wall, wherein the opening is oriented to allow a user positioned outside of the outer wall to see at least a portion of the at least one cone tray therethrough.

9. The heat exchanger of claim 6, wherein each of the radial channels is wedge shaped.

10. The heat exchanger of claim 1, wherein the angle of a tangent formed at any point on the heat exchanging surface of each of the plurality of channel regions relative to the central axis is less than or equal to 45 degrees.

\* \* \* \* \*